US008099690B2

(12) United States Patent
Goswami et al.

(10) Patent No.: US 8,099,690 B2
(45) Date of Patent: Jan. 17, 2012

(54) ADAPTIVE STATE-TO-SYMBOLIC TRANSFORMATION IN A CANONICAL REPRESENTATION

(75) Inventors: Dhiraj Goswami, Wilsonville, OR (US); Ngai Ngai William Hung, San Jose, CA (US); Jasvinder Singh, San Jose, CA (US); Qiang Qiang, Santa Clara, CA (US)

(73) Assignee: Synopsys, Inc., Mountain View, CA (US)

( * ) Notice: Subject to any disclaimer, the term of this patent is extended or adjusted under 35 U.S.C. 154(b) by 269 days.

(21) Appl. No.: 12/430,322

(22) Filed: Apr. 27, 2009

(65) Prior Publication Data

US 2010/0275169 A1 Oct. 28, 2010

(51) Int. Cl.
*G06F 17/50* (2006.01)
(52) U.S. Cl. ........................................................ 716/100
(58) Field of Classification Search .................... 716/100
See application file for complete search history.

(56) References Cited

U.S. PATENT DOCUMENTS

| 7,236,965 | B2 * | 6/2007 | Iyer | 706/46 |
|---|---|---|---|---|
| 7,243,087 | B2 * | 7/2007 | Iyer | 706/46 |
| 7,290,229 | B2 | 10/2007 | Baumgartner | |
| 7,302,417 | B2 * | 11/2007 | Iyer | 706/19 |
| 7,340,704 | B2 | 3/2008 | Baumgartner | |
| 7,353,216 | B2 * | 4/2008 | Iyer et al. | 706/46 |
| 2005/0138585 | A1 * | 6/2005 | Cerny et al. | 716/5 |
| 2006/0248484 | A1 * | 11/2006 | Baumgartner et al. | 716/3 |
| 2008/0092097 | A1 | 4/2008 | Jacobi | |
| 2008/0092098 | A1 * | 4/2008 | Jacobi et al. | 716/5 |
| 2008/0126973 | A1 | 5/2008 | Kline | |
| 2010/0017352 | A1 * | 1/2010 | Maturana | 706/46 |
| 2010/0191679 | A1 * | 7/2010 | Hung et al. | 706/12 |

* cited by examiner

*Primary Examiner* — Suchin Parihar
(74) *Attorney, Agent, or Firm* — Park, Vaughan, Fleming & Dowler LLP; Laxman Sahasrabuddhe

(57) ABSTRACT

Some embodiments provide a system for adaptively performing state-to-symbolic transformation in a canonical representation which is used for generating random stimulus for a constrained-random simulation. The system can construct a canonical representation for a set of constraints using the set of random variables and the subset of the state variables in the constraints. Next, the system can use the canonical representation to generate random stimulus for the constrained-random simulation, and monitor parameters associated with the constrained-random simulation. Next, the system can add state variables to or remove state variables from the canonical representation based at least on the monitored parameters. The system can then use the modified canonical representation which has a different set of state variables to generate random stimulus for the constrained-random simulation.

20 Claims, 6 Drawing Sheets

$$C(a,b,c) = \overline{a} \cdot b \cdot c + a \cdot \overline{b} \cdot c + a \cdot b \cdot \overline{c}$$

SCENARIO 304
rand bit [1:0] a;
bit [1:0] b = 2;
Constraint: a > b;
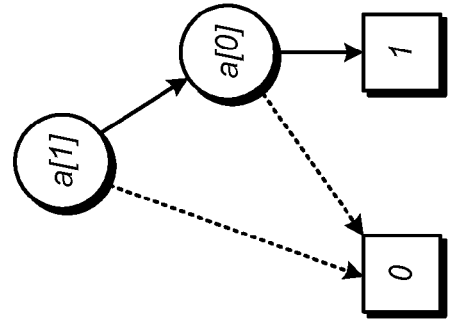
BDD 308
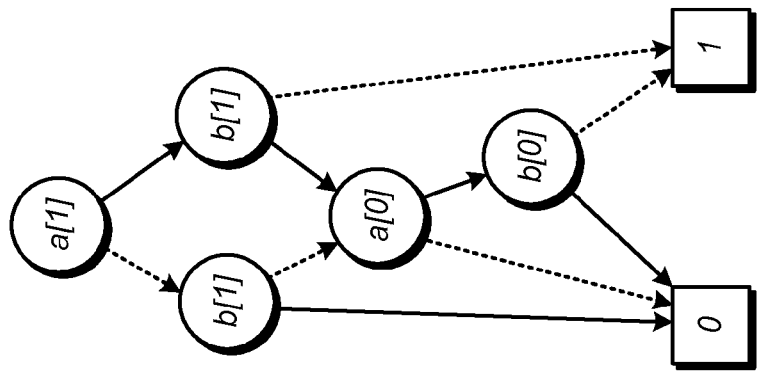
BDD 310
FIG. 3
SCENARIO 302
rand bit [1:0] a;
bit [1:0] b = 1;
Constraint: a > b;
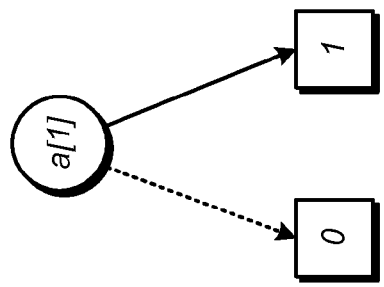
BDD 306

ADAPTIVE STATE-TO-SYMBOLIC TRANSFORMATION IN A CANONICAL REPRESENTATION

FIELD OF THE INVENTION

This disclosure generally relates to electronic design automation. More specifically, the disclosure relates to methods and apparatuses for adaptively performing state-to-symbolic transformations in canonical representations, e.g., binary decision diagrams.

BACKGROUND

Related Art

Rapid advances in computing devices have been made possible by advances in design and verification tools. Indeed, without such tools it would have been almost impossible to design and verify complicated integrated circuits which are commonly found in today's computing devices.

Constrained random simulation methodologies have become increasingly popular for functional verification of complex designs, as an alternative to directed-test-based simulation. In a constrained random simulation methodology, random vectors are generated to satisfy certain operating constraints of the design. These constraints are usually specified as part of a test-bench program. A test-bench automation (TBA) tool uses the test-bench program to generate random solutions for a set of random variables, such that a set of constraints over the set of random variables are satisfied. These random solutions can then be used to generate valid random stimulus for the Design Under Verification (DUV). The random stimulus is used by simulation tools to simulate the DUV, and the results of the simulation are typically examined within the test-bench program to monitor functional coverage, thereby providing a measure of confidence on the verification quality and completeness.

Constraint solvers are typically used to generate random stimulus (e.g., random vectors) that satisfy the set of constraints. The basic functionality of a constraint solver is to solve the following constraint satisfaction problem: given a set of variables and a set of constraints, find a set of values for the set of variables that satisfy the set of constraints. For better software maintenance and quality, the solutions generated by the constraint solver need to be reproducible and deterministic. Further, since users typically require good coverage for the random simulation, the constraint solutions also need to be uniformly distributed.

Unfortunately, the constraint satisfaction problem is NP-complete. Logic simulation, on the other hand, usually scales linearly with the size of the design. As a result, the speed of stimulus generation usually lags far behind the speed at which the stimulus is used in the simulation. Hence, it is desirable to improve performance of a constraint solver because it can significantly improve the overall performance of constrained random simulation tools.

SUMMARY

Some embodiments of the present invention provide techniques and systems to improve performance of a constraint solver by adaptively performing state-to-symbolic transformation in a canonical representation during constrained-random simulation. A canonical representation can be used for generating random stimulus that satisfies a set of constraints which are defined over a set of state variables and a set of random variables. The term "state-to-symbolic transformation" generally refers to adding one or more state variables to a canonical representation and/or removing one or more state variables from a canonical representation.

Note that a canonical representation can be constructed using the set of random variables and a subset of state variables. For example, at the beginning of a constrained-random simulation, the system may use a canonical representation that includes random variables. As the simulation progresses, the system may decide to add state variables to the canonical representation and/or remove state variables from the canonical representation.

Specifically, the system can monitor parameters associated with the constrained-random simulation. In general, the system can monitor parameters that are relevant for determining whether one or more state variables should be added to and/or removed from the canonical representation.

Based partly or wholly on the monitored parameters, the system may select one or more state variables, which are not in the subset of the set of state variables, to add to the canonical representation. Further, the system may select one or more state variables, which are currently in the subset of the set of state variables, to remove from the canonical representation. The system can then construct a canonical representation which includes and/or excludes the selected state variable(s). Next, the system can use the newly constructed canonical representation to generate random stimulus for the constrained-random simulation.

Performing state-to-symbolic transformation in this manner can help the system improve performance. Specifically, adding state variables to the canonical representation can improve performance, but also increase the size of the canonical representation. On the other hand, removing state variables from the canonical representation can decrease the size of the canonical representation, but may detrimentally impact performance. Some embodiments of the present invention use the monitoring data to intelligently decide which state variables to add and/or which state variables to remove from the canonical representation.

BRIEF DESCRIPTION OF THE FIGURES

FIG. 3 illustrates how a BDD can be constructed using random variables and/or state variables in accordance with an embodiment of the present invention.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not limited to the embodiments shown, but is to be accorded the widest scope consistent with the principles and features disclosed herein.

Integrated Circuit (IC) Design Flow

Figure 1:
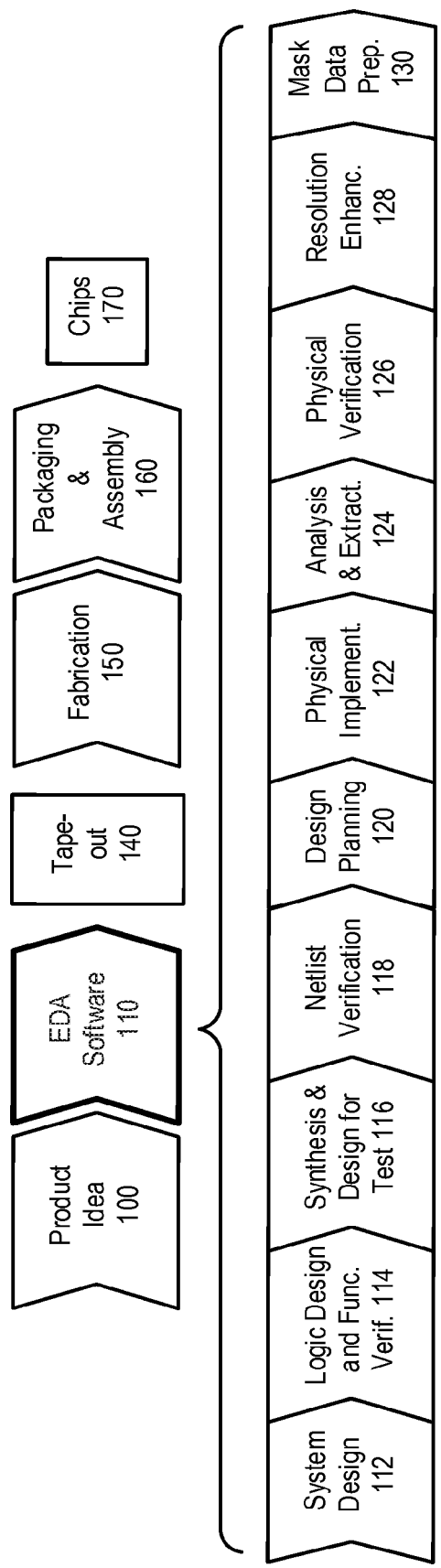
FIG. 1 illustrates various stages in the design and fabrication of an integrated circuit in accordance with an embodiment of the present invention.

FIG. 1 illustrates various stages in the design and fabrication of an integrated circuit in accordance with an embodiment of the present invention.

The process can start with a product idea (step 100) which can be realized using an integrated circuit that is designed using an EDA process (step 110). After the integrated circuit is taped-out (event 140), it can undergo a fabrication process (step 150) and a packaging and assembly process (step 160) to produce chips 170.

The EDA process (step 110) comprises steps 112-130, which are described below for illustrative purposes only and are not meant to limit the present invention. Specifically, the steps may be performed in a different sequence than the sequence described below.

During system design (step 112), circuit designers can describe the functionality that they want to implement. They can also perform what-if planning to refine functionality, check costs, etc. Hardware-software architecture partitioning can also occur at this stage. Exemplary EDA software products from Synopsys, Inc. that can be used at this step include Model Architect, Saber®, System Studio, and DesignWare®.

During logic design and functional verification (step 114), the VHDL or Verilog code for modules in the system can be written and the design can be checked for functional accuracy, e.g., the design can be checked to ensure that it produces correct outputs. Exemplary EDA software products from Synopsys, Inc. that can be used at this step include VCS®, Vera®, DesignWare®, Magellan™, Formality®, ESP and Leda®.

During synthesis and design for test (step 116), the VHDL/Verilog can be translated to a netlist. Further, the netlist can be optimized for the target technology, and tests can be designed and implemented to check the finished chips. Exemplary EDA software products from Synopsys, Inc. that can be used at this step include Design Compiler®, Physical Compiler®, Test Compiler, Power Compiler™, FPGA Compiler, TetraMAX®, and DesignWare®.

During netlist verification (step 118), the netlist can be checked for compliance with timing constraints and for correspondence with the VHDL/Verilog source code. Exemplary EDA software products from Synopsys, Inc. that can be used at this step include Formality®, PrimeTime®, and VCS®.

During design planning (step 120), an overall floorplan for the chip can be constructed and analyzed for timing and top-level routing. Exemplary EDA software products from Synopsys, Inc. that can be used at this step include Astro™ and IC Compiler products.

During physical implementation (step 122), circuit elements can be positioned in the layout (placement) and can be electrically coupled (routing). Exemplary EDA software products from Synopsys, Inc. that can be used at this step include Astro™ and IC Compiler products.

During analysis and extraction (step 124), the circuit's functionality can be verified at a transistor level and parasitics can be extracted. Exemplary EDA software products from Synopsys, Inc. that can be used at this step include AstroRail™, PrimeRail, PrimeTime®, and Star-RCXT™.

During physical verification (step 126), the design can be checked to ensure correctness for manufacturing, electrical issues, lithographic issues, and circuitry. Hercules™ is an exemplary EDA software product from Synopsys, Inc. that can be used at this step.

During resolution enhancement (step 128), geometric manipulations can be performed on the layout to improve manufacturability of the design. Exemplary EDA software products from Synopsys, Inc. that can be used at this step include Proteus/Progen, ProteusAF, and PSMGen.

During mask data preparation (step 130), the design can be "taped-out" to produce masks which are used during fabrication. Exemplary EDA software products from Synopsys, Inc. that can be used at this step include the CATS® family of products.

Some embodiments can be used during one or more of the above-described steps. Specifically, some embodiments can be used during logic design and functional verification (step 114).

Constrained-Random Simulation

Correctly defining the environment under which a given DUV is supposed to work is an important prerequisite for effective design verification. Traditionally, verification engineers have used a test-bench to model the environment of the DUV. The test-bench can be described using a hardware description language. Note that the test-bench typically includes a set of tests which constrain the environment in an appropriate way so as to cover a targeted set of behaviors of the DUV.

Some hardware languages, such as System Verilog, support several advanced constructs for specifying constraints explicitly in a test-bench. Specifically, explicit constraints can be used to restrict the random choices of the test-bench in a way that is consistent with its protocol with the DUV. Such test-benches are typically called constrained random test-benches.

As mentioned above, the performance of random stimulus generation usually lags far behind the performance of logic simulation. Because of this, improving the performance of a constraint solver can have a substantial impact on the overall performance of the test-bench. Hence, it is desirable to improve the performance of a constraint solver.

BDD (Binary Decision Diagram)

In a typical constrained random simulation scenario, users write a set of constraints (e.g., using System Verilog), and during simulation, the constraint solver tries to find a random stimulus (a set of random variable assignments) that satisfies the user-specified constraints. Constraint solvers can use BDD, ATPG, satisfiability, or other similar methods to find the satisfiable solution (random stimulus).

Specifically, in a BDD-based constraint solver, the system typically uses BDDs to represent the constraints. The random variables (used for simulation) are treated as BDD variables, and the conjunction of the constraints (on these variables) is constructed as a Boolean function represented by the BDD. An assignment to these variables would satisfy the constraints if and only if the evaluation of the Boolean function using the assigned values would result in a "TRUE" value.

Figures 2A, 2B:
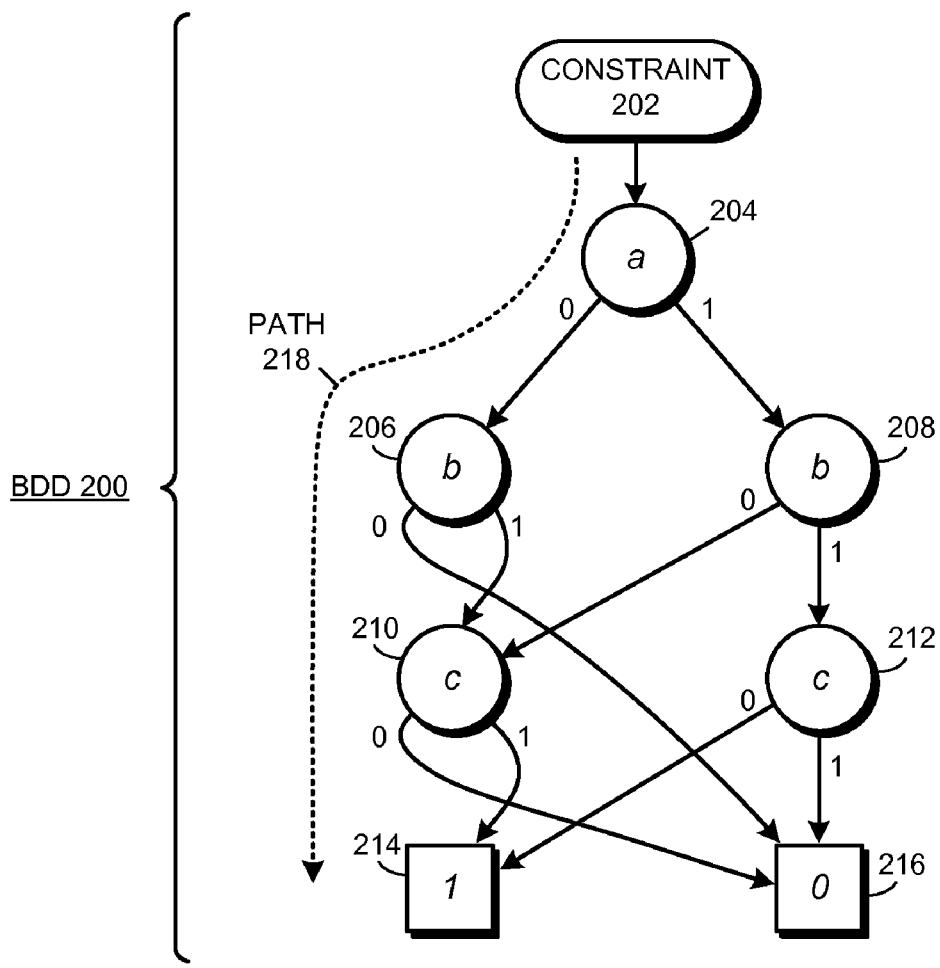
FIG. 2A illustrates a constraint in accordance with an embodiment of the present invention.
FIG. 2B illustrates a BDD in accordance with an embodiment of the present invention.

FIG. 2A illustrates a constraint in accordance with an embodiment of the present invention.

The constraint illustrated in FIG. 2A is a Boolean function over three variables: "a," "b," and "c." The variables are typically used to model the DUV, e.g., the variable "a" may be a random variable that represents the logic state of an input signal in the DUV. Similarly, variable "b" may be a state variable that represents the output of a logic gate in the DUV. Note that, of all the possible value assignments to the random variables, only some value assignments correspond to valid states of the DUV. Since the intent in constrained-random simulation is to verify the DUV over valid states, a technique is needed to restrict the values of the random variables. One technique that is commonly used is to use a set of constraints to restrict the value of the random variables. During constraint-based simulation, the test-bench can generate random inputs (e.g., value assignments for random variables "a," "b," and "c") which satisfy the set of constraints.

One approach for generating random inputs is to use a canonical representation, such as a BDD. Specifically, the system can first generate a BDD that represents the set of constraints. Next, the system can use the BDD to generate random inputs. Specifically, each path in the BDD from the root node to the terminal node that corresponds to the value "1" can be associated with a value assignment that satisfies the set of constraints.

FIG. 2B illustrates a BDD in accordance with an embodiment of the present invention.

BDD 200 can represent the constraint shown in FIG. 2A. BDD 200 includes nodes 202, 204, 206, 208, 210, 212, 214, and 216. Node 202 can be the root node which can be used to represent the entire constraint. Node 204 can be associated with variable "a," nodes 206 and 208 can be associated with variable "b," and nodes 210 and 212 can be associated with variable "c." Node 214 can represent the Boolean value "TRUE" or "1" for the Boolean function. In other words, node 214 can represent a situation in which the constraint has been satisfied. In contrast, node 216 can represent the Boolean value "FALSE" or "0." In other words, node 216 can represent a situation in which the constraint has not been satisfied.

The directed edges in BDD 200 can represent a value assignment to a variable. For example, the directed edge between nodes 204 and 206 can be associated with assigning value "0" to the random variable "a." Similarly, the directed edge between nodes 208 and 212 can be associated with assigning value "1" to the state variable "b."

A directed path in a BDD from the root node, e.g., node 202, to the terminal node for the Boolean value "TRUE," e.g., node 214, can correspond to a value assignment to the variables that satisfies the set of constraints which is being represented by the BDD, e.g., the constraint shown in FIG. 2A. For example, path 218 begins at node 202 and terminates at node 214. The value assignments associated with path 218 are: a=0, b=1, and c=1. It will be evident that this value assignment causes the Boolean function shown in FIG. 2A to evaluate to "TRUE."

Once the system builds the BDD, it can generate constrained random stimulus by determining all distinct paths from the root node to the terminal node associated with the "TRUE" value, and by randomly selecting a path from the set of all distinct paths.

Note that BDDs are only one of the many different types of canonical representations that can be used to generate the random stimulus. A canonical representation of a logical function (e.g., a constraint) can generally be any representation which satisfies the following property: if two logical functions are equivalent, their canonical representations will be the same as long as the same variable ordering (or an equivalent characteristic) is used while constructing the canonical representation. Examples of canonical representations include, but are not limited to, binary decision diagrams, binary moment diagrams, zero-suppressed binary decision diagrams, multi-valued decision diagrams, multiple-terminal binary decision diagrams, and algebraic decision diagrams.

The set of constraints can be defined using state variables and random variables. State variables are variables that are used for representing the internal state of the DUV. For example, a variable that represents the output value of a logic gate can be a state variable. Random variables are variables that are used for representing random inputs to the DUV. For example, a variable that represents the value of one or more bits of an address bus can be a random variable. (Note that a state variable or a random variable can have one or more bits.)

In some techniques, a canonical representation is built using only random variables. The state variables are assigned different values as the simulation progresses. At any given moment in the simulation, this approach builds a canonical representation using the random variables based on the specific values of the state variables. One drawback of this approach is that it slows down the random stimulus generation process because the system has to keep building new canonical representations based on the values of the state variables.

In other techniques, a canonical representation is built using all random and state variables. Unfortunately, this approach is impractical because the resulting canonical representation (e.g., BDD) is usually impracticably large.

In contrast to such conventional techniques, some embodiments of the present invention dynamically determine which state variable to add to the canonical representation. Dynamically adding state variables to the canonical representation allows embodiments of the present invention to improve performance of random stimulus generation without requiring an impractical amount of resources.

FIG. 3 illustrates how a BDD can be constructed using random variables and/or state variables in accordance with an embodiment of the present invention.

In scenario 302, a constraint is defined on two-bit variables "a" and "b." Variable "a" is a random variable, as indicated by the reserved word "rand," whereas variable "b" is not a random variable. In scenario 302, variable "b" is being used to illustrate how the value of a state variable affects the canonical representation that is built for the constraint. Henceforth, in the discussion for FIG. 3, variable "b" will be referred to as a state variable. Note that state variable "b" is assigned the value "1" in scenario 302. BDD 306 represents constraint "a>b" when state variable "b" is equal to 1. The dotted lines in FIG. 3 refer to a bit being assigned the value "0." For example, in BDD 306, the dotted line between node "a[1]" and node "0" indicates that bit "a[1]" has been assigned the value "0."

Scenario 304 illustrates the situation when state variable "b" is assigned the value "2," and BDD 308 represents constraint "a>b" when state variable "b" is equal to "2." Note that BDD 306 is different from BDD 308. When a BDD for a constraint is constructed using random variables (e.g., random variable "a"), the structure of the BDD depends on the values of the state variables in the constraint. Hence, if the system constructs a BDD for a constraint using only the random variables in the constraint, the system may need to keep constructing new BDDs as the values of the state variables in the constraint change during the simulation.

It is possible to create a BDD that includes both the random variables as well as the state variables in the constraint. For example, BDD 310 is a BDD that is constructed using both random variable "a" and state variable "b." Note that BDD 310 has many more nodes than either BDD 306 or BDD 308. For constraints that have a large number of random and state variables, constructing a BDD that includes all of the random and state variables can be computationally impractical.

Some embodiments of the present invention maintain a cache of BDDs that were constructed for different value assignments to the state variables. The system can use the cache to substantially speed up random stimulus generation.

Figure 4:
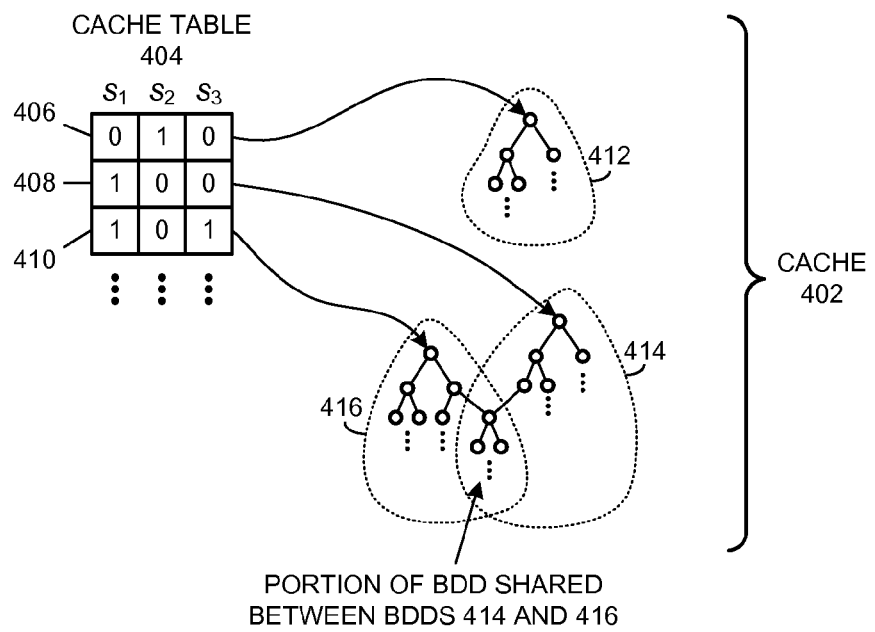
FIG. 4 illustrates how the system can maintain a cache of BDDs in accordance with an embodiment of the present invention.

FIG. 4 illustrates how the system can maintain a cache of BDDs in accordance with an embodiment of the present invention.

Cache 402 can store a number of BDDs. The BDDs can be referenced by cache entries in cache table 404. Note that each entry in cache table 404 can be composed of value assignments to a set of state variables. During operation, the system can use the values of the state variables to look-up cache table 404 to determine whether cache 402 contains a BDD that corresponds to the value assignments to the state variables. If cache table 404 indicates that a BDD exists in cache 402 (i.e., in the event of a cache hit), the system can use the BDD, thereby saving computational resources required for constructing the BDD. If cache 402 does not have a BDD (i.e., in the event of a cache miss), the system can construct a BDD, and optionally store it in cache 402, and optionally add an appropriate cache entry to cache table 404.

For example, as shown in FIG. 4, cache table 404 includes cache entries 406, 408, and 410, which correspond to three distinct value assignments for state variables "$s_1$," "$s_2$," and "$s_3$." Cache entries 406, 408, and 410 point to BDDs 412, 414, and 416, respectively. As the simulation progresses, the values of the state variables "$s_1$," "$s_2$," and "$s_3$" can change, and the system can select the appropriate BDD from cache 402 based on the values of state variables "$s_1$," "$s_2$," and "$s_3$."

Note that the BDDs stored in cache 402 can share parts of the BDD if the corresponding constraints have one or more common subexpressions. For example, the constraints corresponding to BDDs 414 and 416 may have one or more common subexpressions, and hence, a portion of a BDD may be shared between BDDs 414 and 416.

The system may monitor a number of criteria to help determine which state variables to include in the BDD. For example, the system may monitor various parameters associated with state variables "$s_1$," "$s_2$," and "$s_3$." Specifically, the system can monitor the number of times a state variable changes its value, the number of simulation cycles a state variable's value is equal to 0, and the number of simulation cycles a state variable's value is equal to 1. If the system maintains a cache of BDDs, the system can also monitor the number of cache entries in the cache, the cache's hit rate, and the cache's miss rate.

If the system determines that a particular BDD in the cache is not expected to be used to generate random stimulus, the system can remove the BDD from the cache and remove the associated cache entry from the cache table. For example, suppose the system is currently constructing BDDs by using the random variables and a set of state variables $S_1$. Let us further assume that the system decides to perform a state-to-symbolic transformation on one or more state variables. For example, the system may add one or more state variables to $S_1$ to obtain $S_2$, and then use $S_2$ to construct BDDs. The BDDs constructed using $S_1$ and $S_2$ may have common subexpressions, and hence, when the system builds BDDs using $S_2$, it can re-use portions of the BDDs that correspond to the common subexpressions. Subsequently, suppose the system decides to add more state variables to $S_2$ to obtain $S_3$. Again, there may be common subexpressions between BDDs for $S_2$ and $S_3$ that the system can re-use while building BDDs for $S_3$.

Once the system builds the BDDs for $S_3$, the system may decide to remove BDDs or portions of BDDs that were constructed using $S_1$, but which were not re-used when BDDs were constructed for $S_2$ or $S_3$. Specifically, whenever the system adds a state variable to the BDD, the system can keep track of the subexpressions (and the corresponding portions of the BDDs) that were re-used and the ones that were only used in older BDDs. Next, the system can purge the BDDs and the portions of the BDDs that were not re-used when new BDDs were constructed using the new set of state variables. Note that if the system purges BDDs or portions of BDDs too soon, it may reduce performance because the purged BDDs or portions of the purged BDDs may have had common structures with future BDDs.

Figure 5:
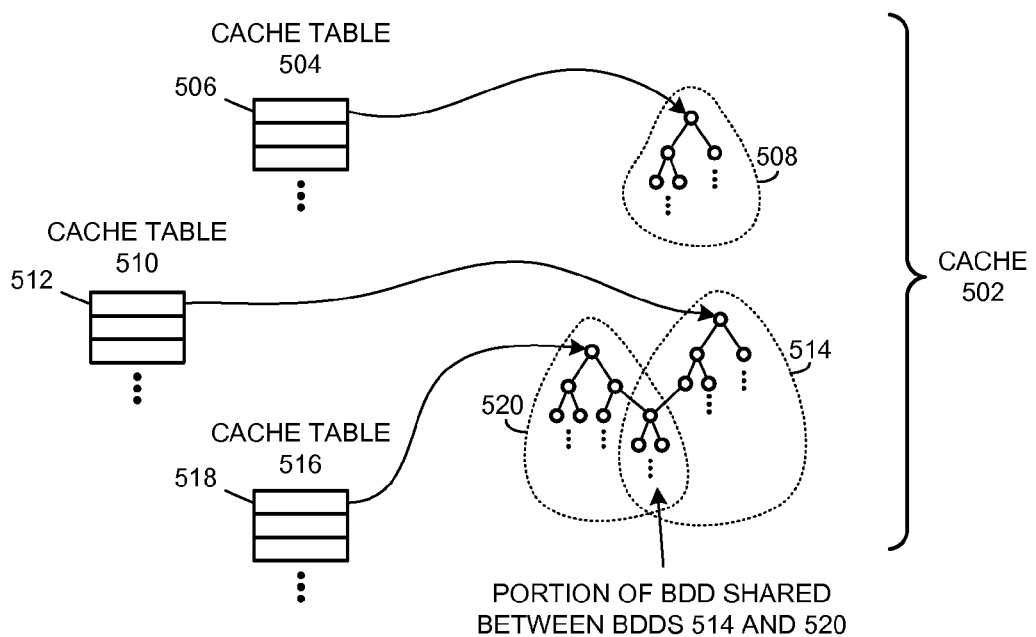
FIG. 5 illustrates how a system can purge BDDs from a cache during constrained-random simulation in accordance with an embodiment of the present invention.

FIG. 5 illustrates how a system can purge BDDs from a cache during constrained-random simulation in accordance with an embodiment of the present invention.

The system may construct BDD 508 using random variables and a subset of state variables. The system may store BDD 508 in cache 502, and maintain cache table 504, which may include entry 506 which points to BDD 508. Next, the system may decide to perform state-to-symbolic transformation on one or more state variables. When the system performs state-to-symbolic transformation on one or more state variables, it typically flushes all of the entries in the cache table, and starts adding entries to the empty cache table as the constrained-random simulation progresses and new BDDs are constructed based on the new set of state variables and random variables.

Note that when the system flushes the cache table, the BDDs in the cache may not be deleted. Specifically, the system can use a BDD manager to manage BDDs in the cache. To delete a BDD from the cache, the system may need to specifically request the BDD manager to delete the BDD. When the system constructs BDDs after a state-to-symbolic transformation, the system may re-use BDDs or portions of BDDs that were used before the state-to-symbolic transformation was performed.

For example, after performing state-to-symbolic transformation, the system may flush cache table 504. Next, the system may start adding cache entries to cache table 510 as it constructs BDDs based on the new set of state variables and random variables. For example, the system may construct BDD 514 and add cache entry 512 to cache table 510 which points to BDD 514. The system may perform another state-to-symbolic transformation, and flush cache table 510. The system can then start adding cache entries to cache table 516 as it constructs BDDs based on the new set of state variables and random variables. For example, the system may construct BDD 520 and add cache entry 518 to cache table 516 which points to BDD 520. (Cache tables 504, 510, and 516 are not necessarily different entities; they have been shown as different entities in FIG. 5 for the sake of clarity.)

When the system adds entries to cache table 510, the system may re-use portions of the BDDs that were used when the system was using the previous set of state variables and random variables to generate random stimulus. For example, when the system constructs BDD 520, it can re-use portions of BDDs that it shares with BDD 514.

Before building BDD 520, the system may decide to delete BDDs that were not used when cache table 510 was being populated. For example, supposed BDD 508 was never used when cache table 510 was being used for constrained-random simulation. The system may decide to delete BDD 508 from the cache before starting to populate cache table 516.

Deleting BDDs can free up space, but it can also lead to performance degradation, because the deleted BDDs may have structures which would have been re-used in the future. In general, the system can use a number of criteria to determine whether a BDD or a portion of a BDD is expected to be used in the future. If the system determines that the BDD or the portion of the BDD is expected to be used in the future, the system may decide to keep the BDD in the cache. If the system determines that the BDD or the portion of the BDD is not expected to be used in the future, the system may decide to delete the BDD from the cache by requesting the BDD manager to delete the BDD.

Note that random stimulus can be generated using various canonical representations. Embodiments of the present invention are not limited to BDDs. Specifically, embodiments of the present invention can be used to perform adaptive state-to-symbolic transformations in any canonical representation. The following sections describe techniques and systems for performing adaptive state-to-symbolic transformation in a canonical representation during constrained-random simulation.

Process for Adaptively Performing State-to-Symbolic Transformation

Figure 6:
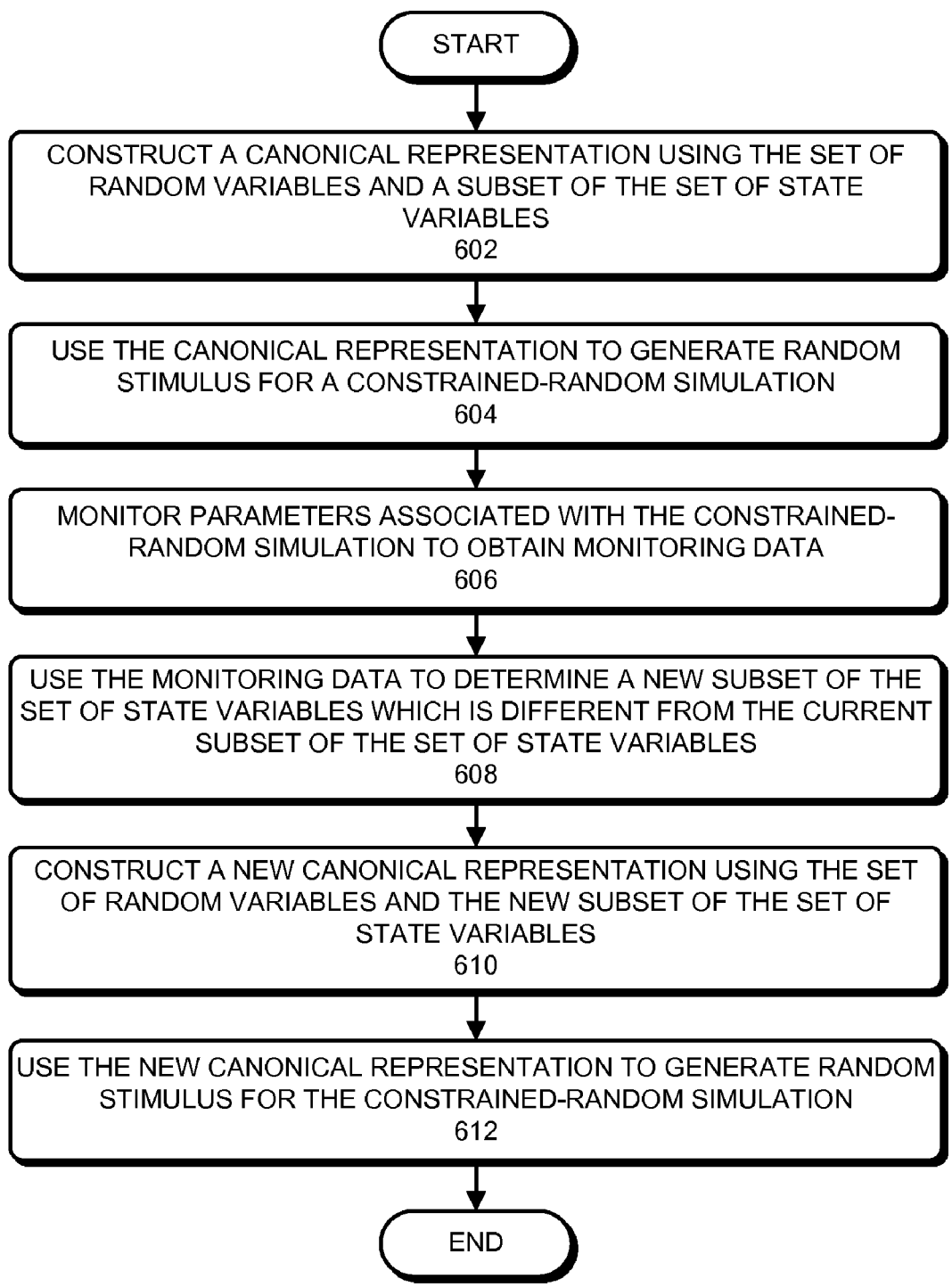
FIG. 6 presents a flow chart that illustrates a process for adaptively performing state-to-symbolic transformation in a canonical representation during constrained-random simulation in accordance with an embodiment of the present invention.

FIG. 6 presents a flow chart that illustrates a process for adaptively performing state-to-symbolic transformation in a canonical representation during constrained-random simulation in accordance with an embodiment of the present invention. As explained above, a system can use a canonical representation for generating random stimulus that satisfies a set of constraints that are defined over a set of state variables and a set of random variables.

The process can begin by constructing a canonical representation using the set of random variables and a subset of the set of state variables (block 602). Next, the system can use the canonical representation to generate random stimulus for the constrained-random simulation (block 604).

Specifically, when the constrained-random simulation begins, the system can construct a canonical representation using only the random variables. As the simulation progresses, the system can add more state variables to the canonical representation. Hence, at any given point during the simulation, the canonical representation can include the set of random variables and a subset of the set of state variables.

The system can maintain a cache of canonical representations, which are used for generating random stimulus during the constrained-random simulation. A cache entry in the cache can point to a canonical representation, and a cache entry's tag can be based at least on values of a subset of the set of state variables.

Note that, during the constrained-random simulation, the values of the state variables are updated to reflect the behavior of the DUV. Since the set of constraints can include both random variables and state variables, a change in the value of one or more state variables can change how valid values are to be chosen for the random variables. In other words, whenever the state variables change values, the system may need to construct a new canonical representation. Some embodiments of the present invention maintain a cache of canonical representations that were constructed during constrained-random simulation. Whenever one or more state variables change their value, the system can determine whether it has a canonical representation in the cache, or whether it needs to construct a new canonical representation for the particular value assignments for the state variables.

The system can then monitor parameters associated with the constrained-random simulation to obtain monitoring data (block 606).

In general, the system can monitor parameters that are relevant for determining whether one or more state variables should be added to or removed from the canonical representation. Different parameters may be given a different level of importance in the decision process.

Specifically, the system can monitor the number of times a state variable (or a set of state variables taken together) changes its value, the number of times a state variable's value is equal to 0, and/or the number of times a state variable's value is equal to 1. Further, the system can also monitor the cache size (e.g., the number of entries in the cache), the cache hit rate, and/or the cache miss rate. Additionally, the system can also monitor the size of the canonical representation (e.g., number of nodes in a BDD or the amount of memory used by a BDD), the rate of growth of the canonical representation with respect to the number of state variables (e.g., the change in BDD-size per state variable). Note that, some parameters, e.g., the size of a canonical representation, can be monitored by a canonical representation manager (e.g., a BDD manager).

Additionally, the system can determine the correlation between two or more state variables, and use the correlation to decide which state variables to add or remove from the canonical representation. For example, if the system determines that there is a strong positive or negative correlation between two state variables, the system can ensure that it does not add both state variables to the canonical representation. This is because, when a strong positive or negative correlation exists between two state variables, adding both state variables to the canonical representation is likely to increase the size of the canonical representation without providing additional performance benefits.

For example, if the system determines that during a particular measurement window, the cache miss rate has exceeded a user-defined threshold, the system can decide to dynamically add one or more state variables to the canonical representation in order to attempt to reduce the cache miss rate. In another scenario, if the system determines that the number the canonical representations is larger than a count threshold, and that the total storage space being used by the canonical representations is less than a storage threshold, the system can decide to dynamically add one or more state variables to the canonical representation to reduce the number of canonical representations that need to be managed. In yet another scenario, if the system determines that the total storage space being used by the canonical representations exceeds a storage threshold, and that the number of canonical representations that are being managed is less than a count threshold, the system may decide to dynamically remove one or more state variables from the canonical representation.

Note that the system may not be able to monitor all state variables, because that can be prohibitively expensive from a resource usage perspective. Consequently, the system may intelligently determine which state variables to monitor. For example, during the simulation, if the system determines that a particular module in the circuit has been turned on (e.g., due to a change in the value of a condition), the system can start monitoring variables that are associated with the module. Similarly, if the system determines that a particular module has been turned off, the system can stop monitoring variables associated with the module to conserve resources.

Next, the system can use the monitoring data to determine a new subset of the set of state variables which is different from the current subset of the set of state variables (block 608). Note that the current subset of the set of state variables is the subset that was used to generate the current canonical representation. Specifically, the system can determine the new subset of the set of state variables by adding one or more state variables to the current subset and/or removing one or more state variables from the current subset. The decision of which state variable(s) to add or remove can be based on the monitoring data.

The system can then construct a new canonical representation using the set of random variables and the new subset of the set of state variables (block 610). The system can optionally remove cache entries that are not expected to be used with the new canonical representation.

Next, the system can use the new canonical representation to generate random stimulus for the constrained-random simulation (block 612). The new canonical representation is expected to improve performance of the stimulus generation process.

Computer System and Apparatus

Figure 7:
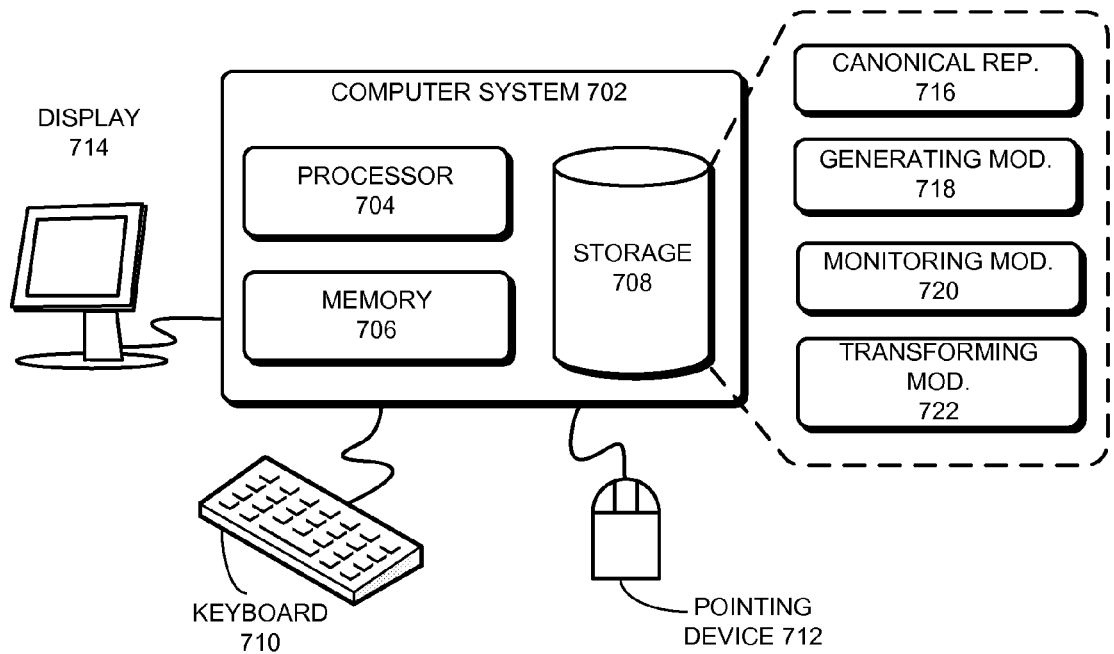
FIG. 7 illustrates a computer system in accordance with an embodiment of the present invention.

FIG. 7 illustrates a computer system in accordance with an embodiment of the present invention.

Computer system 702 comprises processor 704, memory 706, and storage 708. Computer system 702 can be coupled with display 714, keyboard 710, and pointing device 712. Storage 708 can store instructions and/or data that when processed by processor 704 cause computer system 702 to use a canonical representation to generate random stimulus for a constrained-random simulation.

Specifically, storage 708 can store canonical representation 716, generating module 718, monitoring module 720, and transforming module 722. During operation, computer system 702 can load instructions and/or data from storage 708 into memory 706 and process the instructions and/or data using processor 704. Generating module 718 can include instructions for using canonical representation 716 to generate random stimulus. Monitoring module 720 can include instructions for monitoring parameters associated with a constrained-random simulation. Transforming module 722 can include instructions for performing state-to-symbolic transformation based at least on the monitored parameters.

Figure 8:
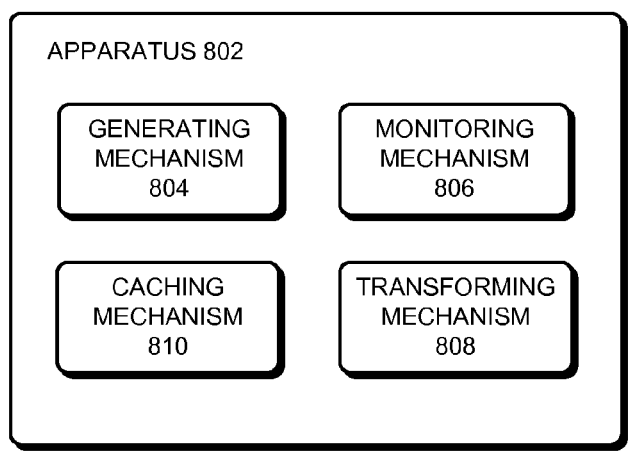
FIG. 8 illustrates an apparatus in accordance with an embodiment of the present invention.

FIG. 8 illustrates an apparatus in accordance with an embodiment of the present invention.

Apparatus 802 can comprise a number of mechanisms, e.g., integrated circuits, which may communicate with one another via a wired or wireless communication channel. Specifically, apparatus 802 can comprise generating mechanism 804, monitoring mechanism 806, caching mechanism 810, and transforming mechanism 808. In some embodiments, generating mechanism 804 can be configured to use a canonical representation to generate random stimulus for a constrained-random simulation; monitoring mechanism 806 can be configured to monitor parameters associated with the constrained-random simulation; caching mechanism 810 can be configured to cache canonical representations; and transforming mechanism 808 can be configured to perform state-to-symbolic transformations.

Apparatus 802 can be part of a computer system or be a separate device which is capable of communicating with other computer systems and/or devices. Apparatus 802 may be realized using one or more integrated circuits. Specifically, one or more mechanisms in apparatus 802 can be implemented as part of a processor.

CONCLUSION

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described in this disclosure can be included and/or executed by hardware modules. For example, the hardware modules can include, but are not limited to, application-specific integrated circuit (ASIC) chips, field-programmable gate arrays (FPGAs), a dedicated or shared processor, and other programmable-logic devices now known or later developed. When the hardware modules are activated, the hardware modules can perform the methods and processes described in this disclosure.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for adaptively performing state-to-symbolic transformation during constrained-random simulation, the method comprising:
   generating, based on a random stimulus for the constrained-random simulation, wherein the first canonical representation represents a set of constraints defined over a set of random variables and a set of state variables, and wherein the first canonical representation is constructed based on the set of random variables and a first subset of the set of state variables;
   monitoring parameters associated with the constrained-random simulation to obtain monitoring data;
   determining, based at least on the monitoring data, a second subset of the set of state variables which is different from the first subset of the set of state variables;
   constructing, by computer, a second canonical representation based on the set of random variables and the second subset of the set of state variables, wherein the second canonical representation represents the set of constraints; and
   generating, based on the second canonical representation, random stimulus for the constrained-random simulation.

2. The method of claim 1, wherein monitoring parameters associated with the constrained-random simulation involves monitoring the number of times a state variable changes its value.

3. The method of claim 1, wherein monitoring parameters associated with the constrained-random simulation involves monitoring the number of simulation cycles a state variable's value is equal to 0.

4. The method of claim 1, wherein monitoring parameters associated with the constrained-random simulation involves monitoring the number of simulation cycles a state variable's value is equal to 1.

5. The method of claim 1, wherein monitoring parameters associated with the constrained-random simulation involves monitoring a canonical representation's size.

6. The method of claim 1, wherein monitoring parameters associated with the constrained-random simulation involves monitoring how many canonical representations are being managed by a canonical representation manager.

7. The method of claim 1, wherein monitoring parameters associated with the constrained-random simulation involves monitoring correlations between two or more parameters associated with the constrained-random simulation.

8. The method of claim 1, wherein monitoring parameters associated with the constrained-random simulation involves monitoring a canonical representation's growth rate.

9. The method of claim 1, further comprising maintaining a cache of canonical representations which are used for generating random stimulus during the constrained-random simulation.

10. The method of claim 9, wherein a cache entry in the cache points to a canonical representation, and wherein the cache entry's tag is based at least on values of one or more state variables.

11. The method of claim 9, further comprising removing cache entries that are not expected to be used with the second canonical representation.

12. The method of claim 9, wherein monitoring parameters associated with the constrained-random simulation involves monitoring the number of cache entries in the cache.

13. The method of claim 9, wherein monitoring parameters associated with the constrained-random simulation involves monitoring the cache's hit rate.

14. The method of claim 9, wherein monitoring parameters associated with the constrained-random simulation involves monitoring the cache's miss rate.

15. A computer-readable storage device storing instructions that when executed by a computer cause the computer to perform a method for adaptively performing state-to-symbolic transformation during constrained-random simulation, the method comprising:
generating, based on a first canonical representation, random stimulus for the constrained-random simulation, wherein the first canonical representation represents a set of constraints defined over a set of random variables and a set of state variables, and wherein the first canonical representation is constructed based on the set of random variables and a first subset of the set of state variables;
monitoring parameters associated with the constrained-random simulation to obtain monitoring data;
determining, based at least on the monitoring data, a second subset of the set of state variables which is different from the first subset of the set of state variables;
constructing a second canonical representation based on the set of random variables and the second subset of the set of state variables, wherein the second canonical representation represents the set of constraints; and
generating, based on the second canonical representation, random stimulus for the constrained-random simulation.

16. The method of claim 15, wherein monitoring parameters associated with the constrained-random simulation involves monitoring the number of times a state variable changes its value.

17. The method of claim 15, wherein monitoring parameters associated with the constrained-random simulation involves monitoring a canonical representation's size.

18. The method of claim 15, wherein monitoring parameters associated with the constrained-random simulation involves monitoring correlations between two or more parameters associated with the constrained-random simulation.

19. The method of claim 15, further comprising maintaining a cache of canonical representations which are used for generating random stimulus during the constrained-random simulation.

20. An apparatus to adaptively perform state-to-symbolic transformation during constrained-random simulation, the apparatus comprising:
a first generating mechanism configured to generate, based on a first canonical representation, random stimulus for the constrained-random simulation, wherein the first canonical representation represents a set of constraints defined over a set of random variables and a set of state variables, and wherein the first canonical representation is constructed based on the set of random variables and a first subset of the set of state variables;
a monitoring mechanism configured to monitor parameters associated with the constrained-random simulation to obtain monitoring data;
a transforming mechanism configured to:
determine, based at least on the monitoring data, a second subset of the set of state variables which is different from the first subset of the set of state variables; and
construct a second canonical representation based on the set of random variables and the second subset of the set of state variables, wherein the second canonical representation represents the set of constraints; and
a second generating mechanism configured to generate, based on the second canonical representation, random stimulus for the constrained-random simulation.

* * * * *